United States Patent [19]

Dreibelbis et al.

[11] Patent Number: 5,682,116
[45] Date of Patent: Oct. 28, 1997

[54] OFF CHIP DRIVER HAVING SLEW RATE CONTROL AND DIFFERENTIAL VOLTAGE PROTECTION CIRCUITRY

[75] Inventors: Jeffrey Harris Dreibelbis, Williston; Thomas Martin Maffitt, Burlington, both of Vt.

[73] Assignee: International Business Machines Corporation, Armonk, N.Y.

[21] Appl. No.: 573,901

[22] Filed: Dec. 18, 1995

Related U.S. Application Data

[63] Continuation of Ser. No. 484,198, Jun. 7, 1995, abandoned, which is a continuation of Ser. No. 255,144, Jun. 7, 1994, abandoned.

[51] Int. Cl.$^6$ ....................................................... H03L 5/00
[52] U.S. Cl. ............................. 327/333; 327/108; 326/80
[58] Field of Search ................................. 307/263, 270, 307/571, 572; 326/17, 20, 56, 57, 58, 80, 81, 87; 327/108, 374, 319, 333

[56] References Cited

U.S. PATENT DOCUMENTS

| | | | |
|---|---|---|---|
| 4,122,360 | 10/1978 | Kawagai et al. | 307/205 |
| 4,678,943 | 7/1987 | Uragami et al. | 326/58 |
| 4,709,162 | 11/1987 | Braceras et al. | 326/86 |
| 4,782,250 | 11/1988 | Adams et al. | 307/473 |
| 4,808,852 | 2/1989 | Kousaka et al. | 307/451 |
| 4,857,763 | 8/1989 | Sakurai et al. | 326/81 |
| 4,972,100 | 11/1990 | Lim et al. | 326/86 |
| 4,977,337 | 12/1990 | Ohbayashi et al. | 307/446 |
| 5,111,075 | 5/1992 | Ferry et al. | 326/87 |
| 5,140,194 | 8/1992 | Okitaka | 326/87 |
| 5,153,450 | 10/1992 | Ruetz | 326/87 |
| 5,170,072 | 12/1992 | Ihara | 307/264 |
| 5,170,073 | 12/1992 | Hahn et al. | 307/270 |
| 5,170,078 | 12/1992 | Hsueh et al. | 307/451 |
| 5,216,289 | 6/1993 | Hahn et al. | 326/87 |
| 5,220,216 | 6/1993 | Woo | 326/87 |
| 5,300,828 | 4/1994 | McClure | 326/17 |
| 5,436,585 | 7/1995 | DiMarco | 327/319 |

*Primary Examiner*—Timothy P. Callahan
*Assistant Examiner*—Jeffrey Zweizig
*Attorney, Agent, or Firm*—James M. Leas

[57] ABSTRACT

An OCD (off chip driver) to be used in either a mixed power supply (i.e. three and five volts) environment, without causing damaging stress to the circuitry, or in a single power supply environment (three volts). The OCD has sequential circuitry to control the slew rate of the current leaving the chip. By providing three output driver circuits, the logic states can control the slew rate (dI/dt) of the current and thus control the switching speed between a logical one and zero. Additionally, with this circuitry, the control logic on the gates of pull up PFETs, the low voltage on the gates will be above a certain level, for example 0.5 volts at the gates that eliminates the PFET's stresses due to the OCD operation in an external 5 volt environment. Furthermore, the logic circuitry is designed to have no direct current penalties; there is no draw of any direct current. Also there are resistors that are operable on the OCD to short out the stress reducing control logic if the chip is intended to operate in only a 3 volt environment.

19 Claims, 3 Drawing Sheets

OFF CHIP DRIVER HAVING SLEW RATE CONTROL AND DIFFERENTIAL VOLTAGE PROTECTION CIRCUITRY

This is a continuation of application Ser. No., 08/484,198, filed on Jun. 7, 1995, now abandoned, which is a continuation of application 08/255,144, filed on Jun. 7, 1994, now abandoned.

This invention concerns an integrated circuit (IC) design. Specifically, the invention involves an off chip driver, or OCD circuit. Uniquely, the OCD is designed to be used in either a mixed power supply (i.e., three and five volts) environment, without causing damaging stress to the circuitry, or in a single power supply environment (three volts). Additionally, the OCD has sequential circuitry to control the slew rate of the current.

BACKGROUND OF THE INVENTION

One major trend in IC design is to shrink the IC package size. This allows a smaller IC to have more circuits placed upon it. This trend has paved the way for creative product designers to make such new electronic marvels as the laptop computer.

Another IC design trend is for all of the ICs on and between PCBs to use lower supplies of power, for example using 3.3 volts. This is particularly true for laptops that rely on a limited power supply, such as a battery.

PROBLEMS

These trends have been very beneficial, but only while all of the ICs used in a computer use the same amount of voltage. However, not all ICs require the same amount of voltage to operate, and this can cause major problems.

For example, memory chips, like DRAMs, are often made to only use 3.3 volts while the logic circuitry, like a programmable logic device or PLD, would be using 5.0 volts. If these two ICs are connected, the 5 volts from the logic circuitry will cause damaging stress to the 3 volt memory chips.

Consequently, circuit designers need to design circuitry that allows for the connection of lower voltage devices to higher voltage devices without causing damaging stress.

It is noted that the above described problems, and other problems, are solved through the subject invention and will become more apparent, to one skilled in the art, from the detailed description of the subject invention.

SUMMARY OF THE ILLUSTRATED EMBODIMENTS

This invention concerns an integrated circuit (IC) design. Specifically, the invention involves an off chip driver, or OCD circuit. Uniquely, the OCD is designed to operate in either a mixed power supply (i.e., three and five volts) environment, without causing damaging stress to the lower voltage device circuitry, or to operate in a single power supply environment (three volts).

Additionally, the OCD has sequential circuitry to control the slew rate of the current leaving the chip. Specifically, by providing three output driver circuits, the logic states can control the slew rate (dI/dt) of the current and thus also controlling the switching speed.

Another advantage of the invention is that logic circuitry provides for elevated low gate voltages on activated PFETs. This eliminates the damaging stresses on the PFETs due to the OCD operation with a higher off chip voltage environment.

Another feature of the invention is that there are resistors that are operable on the OCD if it operates in a 3 volt environment. However, if there is a five volt environment, then these resistors will not be included in the design, or simply be disabled.

Yet another feature of the invention is that tristate signal is used to activate or inactivate the OCD.

Other features and advantages of the present invention will become more clear from the following detailed description of the invention, taken with the accompanying drawings and claims.

Figure 1:
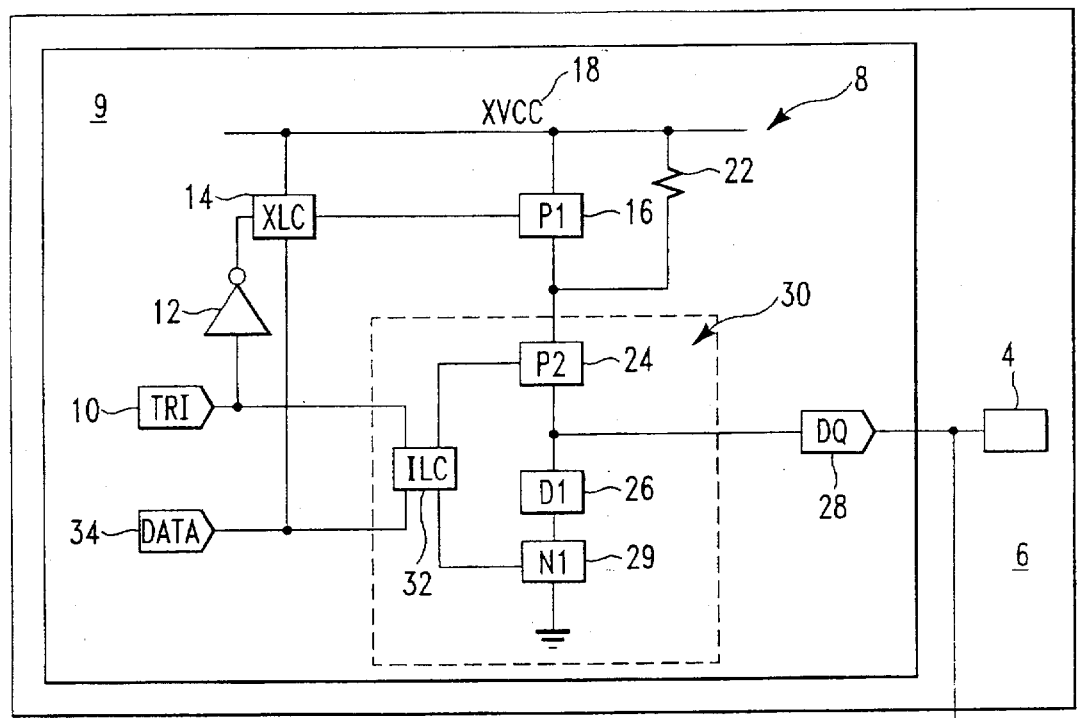
FIG. 1 is a general block diagram of a first embodiment of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail by the accompanying drawings, specification, and claims. Additionally, like numbering in the drawings represent like elements within and between drawings.

Additionally, it is noted that in the drawings there are shown P-channel field effect transistors, or PFETs, shown by a rectangle with a diagonal line formed therein along with a gate electrode arranged adjacently thereto. Further, there are N-channel field effect transistors, or NFETs, indicated by a rectangle without a diagonal line therein and a gate electrode arranged adjacent thereto. Other logic symbols, like inverters, NANDs, and NORs are of conventional symbology.

INCORPORATION BY REFERENCE

The following four listed patents are herein incorporated by reference for pertinent and supporting information:

U.S. Pat. No. 5,170,072, is a buffer device having a booster circuit for a semiconductor memory device.

U.S. Pat. No. 4,808,852, is an input circuit having level shift.

U.S. Pat. No. 4,782,250, is a CMOS off chip driver circuit.

U.S. Pat. No. 4,709,162, is an off chip driver circuit.

DESCRIPTION OF THE ILLUSTRATED EMBODIMENTS

1. Discussion of FIG. 1

FIG. 1 is a general block diagram of the invention, having the following elements: a printed circuit board (PCB) 6; a first IC device 4 mounted on the PCB; a bus line 5 connected to other devices, located on or off of the PCB; and a second IC 9 coupled to the line 5 (or bus) and IC 4, and mounted on the PCB.

The second IC 9 contains the illustrated OCD circuit, with the illustrated connections and elements as follows: a tristate signal input node 10; an invertor 12 coupled to the tristate input node; a first exterior logic circuitry (XLC) 14 which receives the inverse of the tristate signal; a first PFET 16 having the gate controlled by the output of XLC 14; an off chip power rail 18; and (XVCC), being at 5 volts in this embodiment, and coupled to a first PFET (P1) 16 and the XLC 14; a bypass resistor 22 coupled to the off-chip power rail for bypassing the first PFET (see below for more details); and an output driver circuit 30 coupled to the bypass resistor 22, first PFET, and tristate signal input node 10.

Output driver 30 (or just driver) is made up of the following components: a second PFET (P2) 24, being coupled to the bypass resistor 22 and P1; a first NFET configured with its gate biased at the internal power supply (D1) 26, coupled to P2 and an output node (DQ) 28; a first NFET (N1) 29 coupled between D1 and a ground source; and an internal logic circuitry (ILC) 32, controlling the pull up or pull down on P2 and N1.

Additionally, the OCD 8 has the output node (DQ) 28, coupled between and to the P2 and D1; and a data input node 34, which is coupled to the XLC 14 and ILC 32.

2. Operation of FIG. 1

In operation of the invention as illustrated in FIG. 1, only the critical state when the damaging stresses take place, will be discussed. Specifically, the critical state occurs when the off chip signal on DQ is to be driven to a logic high, and when the gates of P1, P2, and N1 are pulled low.

Two logic signals are input to OCD 8, a low tristate signal and a high data signal, via nodes TRI and DATA, respectively. Both logic signals are directed to both control logic circuits 14 and 32, except that the tristate signal is inverted by invertor 12 before entering XLC 14. XLC 14 also has input from the exterior higher voltage source XVCC 18 (typically at 5 volts). In response to the OCD 8 input signals, XLC will pull the gate on P1 to a low voltage being a threshold Vt above ground (e.g. 0.5 volts); thus allowing the full supply voltage XVCC 18 to pass through P1 and to P2.

Simultaneously, ILC 32 will pull the gate of P2 also to a threshold above ground, to allow the current from XVCC to pass through P1 and P2, and to output a full logical one (eg. the voltage of XVCC) over node DQ. Specifically, it is noted that by having two PFETS in series, node DQ can be driven to a full XVCC voltage (e.g. 5 volts).

In the prior art, NFETs were used as voltage and current supplies for the pullup PFETS. This situation prevents a full voltage output when there is a higher off-chip voltage.

Additionally, by controlling the voltage swing that is allowed to be applied to the gates of P1 and P2 to be no lower than a Vt threshold above ground, the current is limited and the gate stresses limited to at most XVCC-Vt. The limited stress prevents the damaging dielectric breakdown and hot electron effects.

Additionally, and simultaneously to P1 and P2 operations, N1 will be deactivated by pulling the gate on N1 to ground in response to the low-going signal from ILC 32. It is noted that D1 also helps prevent the voltage across N1 from being a full XVCC to zero difference because D1 adds a diode drop that again keeps the maximum voltage across N1 to be XVCC-Vt.

It is noted that in the above described operation, OCD circuit 8 will not use resistor 22. Resistor 22 is only needed when both the on-chip and off-chip voltages are the same (e.g. 3.3 volts). In other words, there is a single power supply and there is little concern for damaging stresses being applied to the OCD. In operation, resistor 22 would be added at the second metal level to short P1 and provide a supply voltage directly to P2. This resistor option design allows for a single chip 9 to be used for both voltage situations.

It is further noted that XLC will tristate (or go inactive) when either a logical zero is to be output over node DQ (DATA low), or when the OCD is to be held at a tristate output (TRI high). However, there are no device stress concerns in this state of operation because with P1 off, the gate of P1 is high, and the voltage across P1 is insufficient to create any damaging stresses to the gate.

3. Discussion of FIGS. 2, 3, and 4

Figure 2:
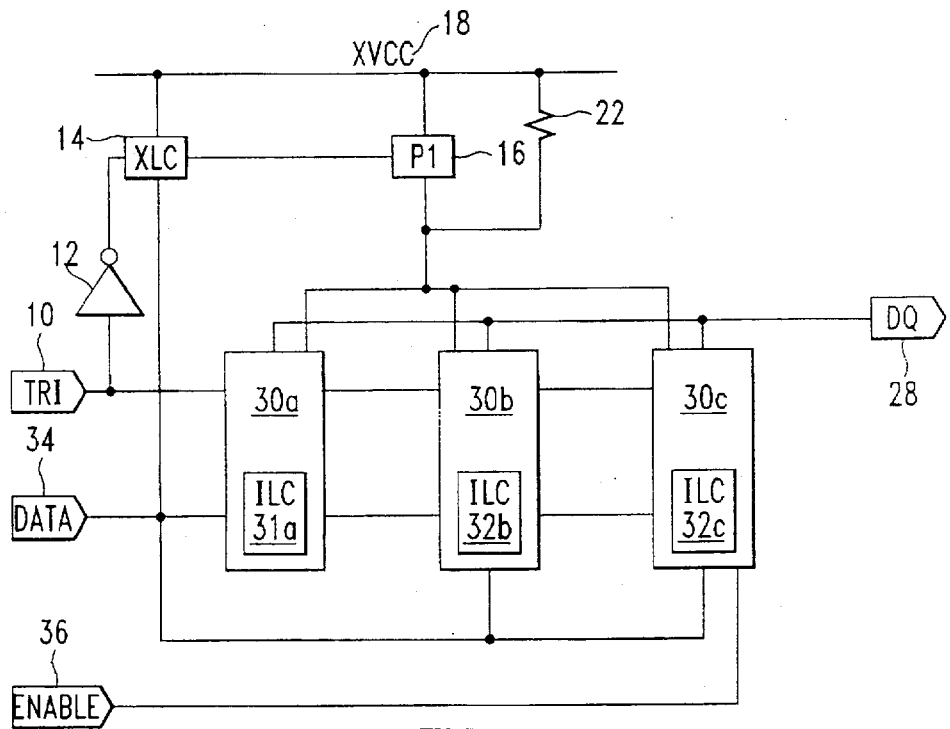
FIG. 2 is a general block diagram of a second embodiment of the invention.

FIG. 2 is a general block diagram of an implementation of one embodiment of the invention, having the following additional elements over FIG. 1. There are three logic controlled driver circuits 30a, 30b, and 30c. Each driver circuit has the same purpose and comprising relatively the same devices as the output driver circuit 30 (for exact details see FIGS. 3 and 4). There is also illustrated an enablement signal node 36 connected as illustrated.

FIG. 2 operates just as described in FIG. 1, except that there are three sequential drive circuits provided instead of the single driver circuit 30 in FIG. 1. For example, the third output driver (or driver) 30c receives an enable signal from node 36. The enable signal can activate or deactivate the entire third driver 30c. If the third driver is off, only drivers 30a and 30b will be operating. The advantage in being able to select either two or all three drivers is that an optimal slew rate (dI/dt) can be chosen to match the specified load inductance on DQ.

Figure 3:
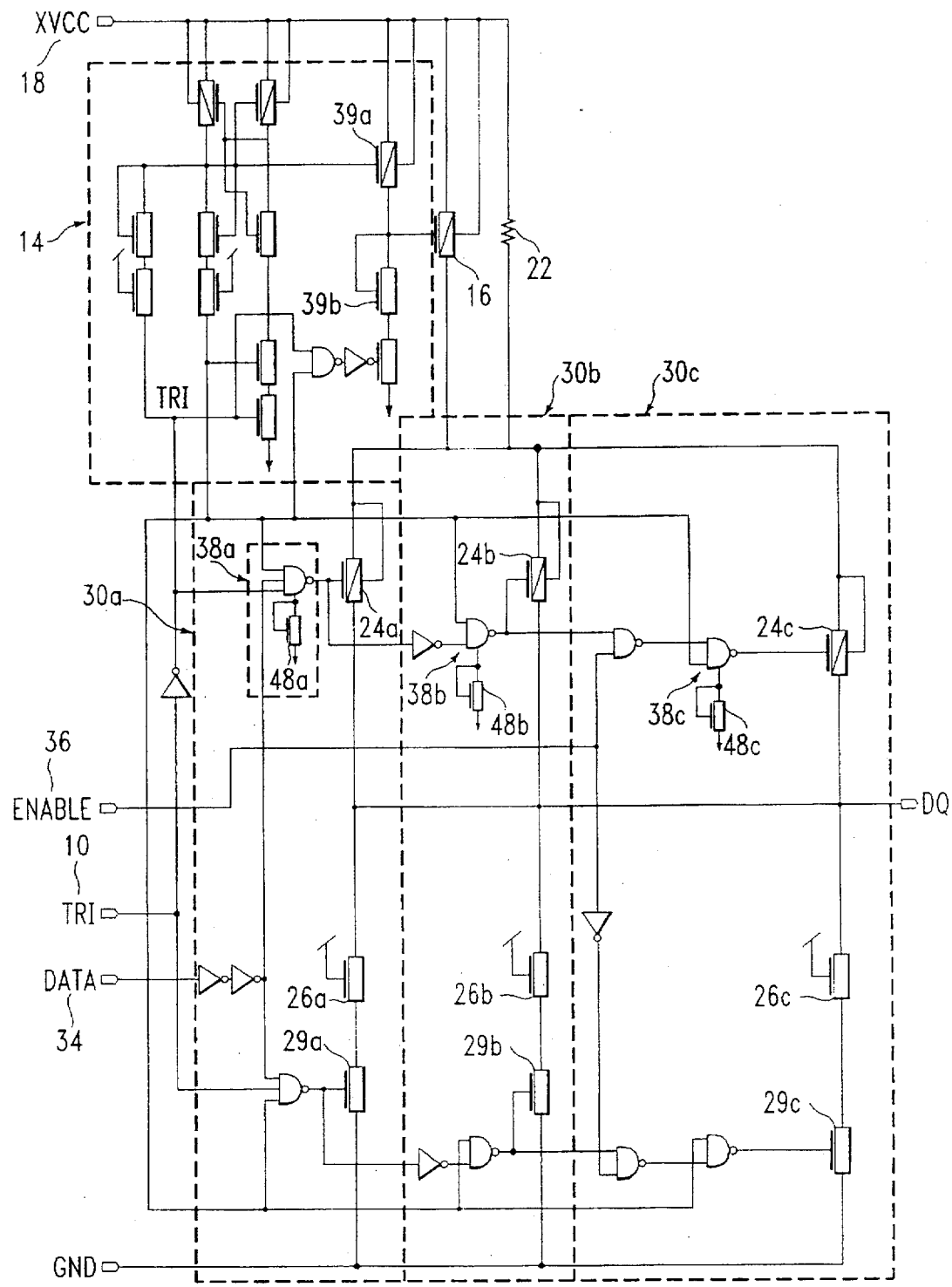
FIG. 3 is a detailed schematic of the second embodiment of the invention.

FIG. 3 presents a detailed schematic of the invention. It is noted that similar numbering represents similar devices between FIGS. 1, 2, and 3. It is noted that NAND logic gate 38a, with attached diode 48a, is illustrated in FIG. 4.

Shown in FIG. 3 is an embodiment of XLC 14 showing that XVCC is applied to the gate of P1 when PFET 39a is on, assuring that P1 can be in an off state. NFET 39b, wired as a diode, restricts swing of the potential applied to the gate of PFET 16 to at least a threshold voltage above ground, thereby reducing voltage stress on the gate dielectric of FET 16 compared with applying ground voltage to that gate.

FIG. 3 also shows schematics of the three sequential driver circuits of FIG. 2. As is clear from FIG. 3, PFETs 24a, 24b, and 24c (corresponding to P2 of FIG. 1) of respective driver circuits 30a, 30b, and 30c turn on sequentially while NFETs 29a, 29b, and 29c (corresponding to N1 of FIG. 1) turn off together when data input 34 goes high. Likewise, when data input 34 goes low, PFETs 24a, 24b, and 24c turn off together while NFETs 29a, 29b, and 29c turn on sequentially.

Figure 4:
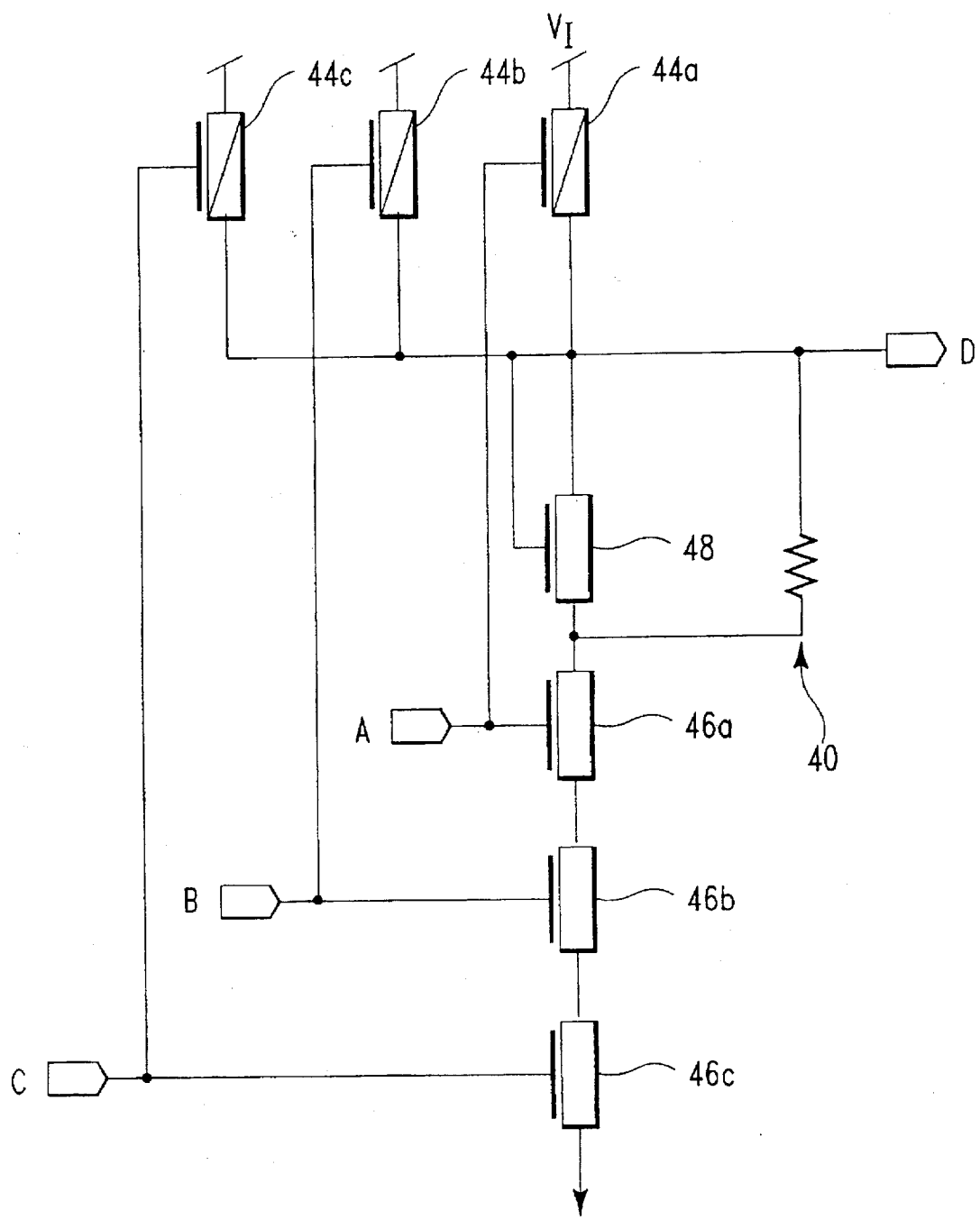
FIG. 4 is a detailed schematic of one embodiment of a three input logic NAND device shown in FIG. 3.

FIG. 4 presents a schematic of one embodiment of a standard three input NAND gate, with the addition of FET 48 wired as a diode to provide NAND gate 38a, which is illustrated in FIG. 3. In particular, there are three input nodes A, B, and C, and one output node D. Depending upon whether the three input signals are high or low, a sequence of PFETs 44a–c and NFETs 46a–c will be activated and deactivated, which in turn determine whether a high or low logic signal is output on node D. It is noted that diode 48 acts as a gate between the PFETs and NFETs to keep the output node D from falling to ground (to again prevent high voltage stresses across PFET 24a driven by the NAND gate). It is also noted that resistor 40 has a similar function as resistor 22, which was discussed earlier.

NAND gates 38b and 38c operate just as 38a, except that there are only two input nodes to the device.

DISCUSSION AND REMARKS ABOUT THE INVENTION

The illustrated invention overcomes the discussed problems of device stress and breakdown.

It is noted that by providing three output driver circuits 30a, b, and c, the logic circuits can, in addition to controlling the slew rate (dI/dt) of the current, can control the switching speed at output node DQ 28 between a logical one and zero. It is further noted, with a staged or sequential turning on of the three drivers (both the P and NFETs) 30a–c, there are no crowbar effects (i.e. no overlap currents).

Furthermore, a skilled artisan will notice that the logic circuitry XLC 14 is designed to have no direct current penalties. In other words, either the PFETs or NFETs are off in a given cycle, to preclude a direct current path between XVCC and ground.

MODIFICATIONS TO THE INVENTION

A skilled artisan will easily be able to modify the basic invention in several ways as discussed as follows:

The control of the slew rate (dI/dt) can have more or less stages than the illustrated three stages of 38a–c, allowing for varying the control of over the slew rate.

The logic circuitry XLC and ILC can be modified to use different combinations of components and devices.

Signals other than the data 34, tristate 10, and enable 36 signals could be used to control the operation of the OCD circuit 8.

This invention contemplates being used in any situation where there is a difference between the off-chip and on-chip power sources or voltages, no matter how large or small the difference. For example a 3 volt range off the chip compared to a one volt range on the chip could be practiced.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. It will also be understood that the invention is not limited to the particular embodiment described herein, but is capable of numerous rearrangements, modifications and substitutions without departing from the scope of the invention. The scope of the invention is, therefore, indicated by the appended claims rather than by the foregoing description. All changes that come within the meaning and range of equivalency of the claims are to be embraced within their scope.

Although subheadings in the Description of the Illustrated Embodiment are used, these are merely provided for assisting the reader; wherein, the writer is free to enter any information under any heading/s.

What is claimed is:

1. An integrated circuit chip capable of being supplied with a high voltage while operating at an internal voltage level less than the high voltage, the chip comprising:

a first PFET comprising a first gate, a first gate dielectric, a first source, and a first drain, said first source connected to the high voltage;

an exterior logic circuit connected to said first gate and to the high voltage, said exterior logic circuit capable of providing the high voltage to said first gate so as to assure that said first PFET is in an off state; and a second PFET comprising a second gate, a second gate dielectric, a second source and a second drain, said second source connected to said first drain, said second gate connected to receive the internal voltage level, the internal voltage level being less than the high voltage.

2. An integrated circuit chip as recited in claim 1, further comprising an output driver circuit comprising an output node, said second PFET being a part of said output driver circuit.

3. An integrated circuit chip as recited in claim 2, wherein said output node is connected to said second drain.

4. An integrated circuit chip as recited in claim 2, said output driver circuit further comprising an internal logic circuit connected to said second gate.

5. An integrated circuit chip as recited in claim 4, said internal logic circuit comprising a NAND gate having a component and an output, said component shifting the level of said output to a voltage above ground voltage, thereby reducing voltage stress on said second gate dielectric.

6. An integrated circuit chip as recited in claim 1, further comprising an NFET connected between said second drain and a ground potential, said NFET comprising a third gate, a third gate dielectric, a third source, and a third drain.

7. An integrated circuit chip as recited in claim 6, further comprising a component between said second drain and said NFET, said component for restricting swing of said third drain to a potential below the high voltage, thereby reducing voltage stress on said third gate dielectric.

8. An integrated circuit chip as recited in claim 6, said third gate being connected to an internal logic circuit.

9. An integrated circuit chip as recited in claim 1, further comprising a plurality of driver circuits, each of said driver circuits comprising one said second PFET.

10. An integrated circuit chip as recited in claim 9, wherein said plurality of second PFETs turn on sequentially when data changes to an internal high level.

11. An integrated circuit chip as recited in claim 10, wherein said plurality of output driver circuits each further comprises an NFET connected between said second drain and a ground potential.

12. An integrated circuit chip as recited in claim 11, wherein said NFETs of each of said plurality of driver circuits turn off simultaneously when data changes to an internal high level.

13. An integrated circuit chip as recited in claim 12, wherein said second PFETs of each of said plurality of driver circuits turn off simultaneously and said plurality of NFETs turn on sequentially when data changes to an internal low level.

14. An integrated circuit chip as recited in claim 9, said chip further comprising a signal path to enable or disable one of said driver circuits.

15. An integrated circuit chip as recited in claim 9, said plurality of output driver circuits each further comprising an internal logic circuit connected to said second gate.

16. An integrated circuit chip as recited in claim 1, wherein said second drain has a second drain voltage, said second drain voltage being capable of approximately equaling said high voltage.

17. An integrated circuit chip as recited in claim 1, further comprising a component in said exterior logic circuit, said component for restricting swing of said first gate to a potential above ground, thereby reducing voltage stress on said first gate dielectric.

18. An integrated circuit chip as recited in claim 4, further comprising a component in said internal logic circuit, said component for restricting swing of said second gate to a potential above ground, thereby reducing voltage stress on said second gate dielectric.

19. A CMOS integrated circuit chip for operation at an internal voltage that is less than a signal voltage, comprising, a driver circuit having both PFET and NFET devices, said devices having gate dielectrics;

an output node of the driver circuit capable of being driven both to ground voltage and to the signal voltage; and wherein, during normal operation of the chip, gate-to-source voltage and gate-to-drain voltage of devices associated with said driver circuit never exceed the internal voltage, the internal voltage being at least a threshold voltage less than the signal voltage to limit voltage stress on said gate dielectrics.

* * * * *